United States Patent
Kim et al.

(10) Patent No.: US 7,308,104 B1
(45) Date of Patent: Dec. 11, 2007

(54) FORWARD MULTIPLE SCRAMBLING CODE GENERATING METHOD AND APPARATUS

(75) Inventors: Ki Jun Kim, Seoul (KR); Young Jo Lee, Seoul (KR); Young Cho Kim, Seoul (KR)

(73) Assignee: LG Information & Communications, Ltd., Seoul (KR)

( * ) Notice: Subject to any disclaimer, the term of this patent is extended or adjusted under 35 U.S.C. 154(b) by 695 days.

(21) Appl. No.: 09/637,698

(22) Filed: Aug. 15, 2000

(30) Foreign Application Priority Data

Aug. 17, 1999 (KR) .............................. 1999-33976

(51) Int. Cl.
*H04L 9/00* (2006.01)

(52) U.S. Cl. .................... 380/268; 380/31; 380/33; 380/44; 380/45; 380/46; 380/47; 380/270; 380/272; 380/273; 380/275; 380/247; 455/42; 455/43; 455/509

(58) Field of Classification Search ................ 380/252, 380/267, 268, 28–30, 44–47, 31, 33, 270, 380/272, 273, 275, 247; 370/342; 725/31; 455/42, 43, 509
See application file for complete search history.

(56) References Cited

U.S. PATENT DOCUMENTS

| | | | | |
|---|---|---|---|---|
| 6,141,374 | A * | 10/2000 | Burns .......................... | 375/152 |
| 6,339,646 | B1 * | 1/2002 | Dahlman et al. ............ | 380/273 |
| 6,385,264 | B1 * | 5/2002 | Terasawa et al. ............ | 375/371 |
| 6,389,138 | B1 * | 5/2002 | Li et al. ....................... | 380/35 |
| 6,496,474 | B1 * | 12/2002 | Nagatani et al. ............ | 370/208 |
| 6,560,212 | B1 * | 5/2003 | Parasad et al. .............. | 370/335 |
| 6,738,411 | B1 * | 5/2004 | Ogawa et al. ............... | 375/130 |
| 2005/0084112 | A1 * | 4/2005 | Kim et al. .................. | 380/268 |

FOREIGN PATENT DOCUMENTS

| | | |
|---|---|---|
| EP | 963 070 A1 | 12/1999 |
| WO | WO/01/05 079 A1 | 1/2001 |
| WO | WO 01/05079 A1 * | 1/2001 |
| WO | WO 01/13655 A1 * | 2/2001 |

OTHER PUBLICATIONS

TSGR1#6(99)915, "TSG-RAN Working Group 1 meeting # 5", Helsinki, Filand, Jul. 13-16, 1999.*

* cited by examiner

*Primary Examiner*—Kim Vu
*Assistant Examiner*—Beemnet W Dada
(74) *Attorney, Agent, or Firm*—KED & Associates, LLP

(57) ABSTRACT

Disclosed are a forward multiple scrambling code generating method and apparatus in a communication system. Each base station uses primary scrambling codes and an associated one of secondary scrambling code sets, each consisting of a plurality of secondary scrambling codes. When an n-th one of the primary scrambling codes is to be generated, an initial value of the scrambling code generator is set with a binary value of "n," so that a desired primary scrambling code is generated using the initial value. When an n-th one of the secondary scrambling codes in an m-th one of the secondary scrambling code sets is to be generated, an initial value of the scrambling code generator is set with a value obtained by shifting the n-th primary scrambling code by m times, thereby generating a desired secondary scrambling code. Since the primary and secondary scrambling codes are simultaneously generated using a single code generator, the manufacturing costs and load are reduced, and the size and power consumption of user elements are reduced. It is also possible to reduce the number of calculations required to set the initial values required for the generation of scrambling codes.

6 Claims, 7 Drawing Sheets

FIG. 3
(Related Art)

| SC1 | 1st PRIMARY SCRAMBLING CODE |
|---|---|
| SC2 | 1st SECONDARY CODE SET ASSOCIATED WITH 1st PRIMARY SCRAMBLING CODE |
| ⋮ | |
| SC M+1 | Nth SECONDARY CODE SET ASSOCIATED WITH 1st PRIMARY SCRAMBLING CODE |
| SC (M+1)×1+1 | 2nd PRIMARY SCRAMBLING CODE |
| SC (M+1)×1+2 | 1st SECONDARY CODE SET ASSOCIATED WITH 2nd PRIMARY SCRAMBLING CODE |
| ⋮ | |
| SC (M+1)×2 | Mth SECONDARY CODE SET ASSOCIATED WITH 2nd PRIMARY SCRAMBLING CODE |
| ⋮ | |
| SC (M+1)×(N−1)+1 | Nth PRIMARY SCRAMBLING CODE |
| SC (M+1)×(N−1)+2 | 1st SECONDARY CODE SET ASSOCIATED WITH Nth PRIMARY SCRAMBLING CODE |
| ⋮ | |
| SC (M+1)×N | Mth SECONDARY CODE SET ASSOCIATED WITH Nth PRIMARY SCRAMBLING CODE |

N×(M+1) SCRAMBLING CODES

FIG. 7

<TABLE 1>

| | $x_{17}$ | $x_{16}$ | $x_{15}$ | $x_{14}$ | $x_{13}$ | $x_{12}$ | $x_{11}$ | $x_{10}$ | $x_9$ | $x_8$ | $x_7$ | $x_6$ | $x_5$ | $x_4$ | $x_3$ | $x_2$ | $x_1$ | $x_0$ |
|---|---|---|---|---|---|---|---|---|---|---|---|---|---|---|---|---|---|---|
| P | 0 | 0 | 0 | 0 | 0 | 0 | 0 | 1 | $n_8$ | $n_7$ | $n_6$ | 1 | $n_5$ | $n_4$ | $n_3$ | $n_2$ | $n_1$ | $n_0$ |
| $S_1$ | $n_0 \oplus n_6$ | 0 | 0 | 0 | 0 | 0 | 0 | 0 | 1 | $n_8$ | $n_7$ | $n_6$ | 1 | $n_5$ | $n_4$ | $n_3$ | $n_2$ | $n_1$ |
| $S_2$ | $n_1 \oplus n_7$ | $n_0 \oplus n_6$ | 0 | 0 | 0 | 0 | 0 | 0 | 0 | 1 | $n_8$ | $n_7$ | $n_6$ | 1 | $n_5$ | $n_4$ | $n_3$ | $n_2$ |
| $S_3$ | $n_2 \oplus n_8$ | $n_1 \oplus n_7$ | $n_0 \oplus n_6$ | 0 | 0 | 0 | 0 | 0 | 0 | 0 | 1 | $n_8$ | $n_7$ | $n_6$ | 1 | $n_5$ | $n_4$ | $n_3$ |
| $S_4$ | $n_3 \oplus 1$ | $n_2 \oplus n_8$ | $n_1 \oplus n_7$ | $n_0 \oplus n_6$ | 0 | 0 | 0 | 0 | 0 | 0 | 0 | 1 | $n_8$ | $n_7$ | $n_6$ | 1 | $n_5$ | $n_4$ |
| $S_5$ | $n_4$ | $n_3 \oplus 1$ | $n_2 \oplus n_8$ | $n_1 \oplus n_7$ | $n_0 \oplus n_6$ | 0 | 0 | 0 | 0 | 0 | 0 | 0 | 1 | $n_8$ | $n_7$ | $n_6$ | 1 | $n_5$ |
| $S_6$ | $n_3$ | $n_4$ | $n_3 \oplus 1$ | $n_2 \oplus n_8$ | $n_1 \oplus n_7$ | $n_0 \oplus n_6$ | 0 | 0 | 0 | 0 | 0 | 0 | 0 | 1 | $n_8$ | $n_7$ | $n_6$ | 1 |
| $S_7$ | 1 | $n_5$ | $n_4$ | $n_3 \oplus 1$ | $n_2 \oplus n_8$ | $n_1 \oplus n_7$ | $n_0 \oplus n_6$ | 0 | 0 | 0 | 0 | 0 | 0 | 0 | 1 | $n_8$ | $n_7$ | $n_6$ |
| $S_8$ | $n_7$ | 1 | $n_5$ | $n_4$ | $n_3 \oplus 1$ | $n_2 \oplus n_8$ | $n_1 \oplus n_7$ | $n_0 \oplus n_6$ | 0 | 0 | 0 | 0 | 0 | 0 | 0 | 1 | $n_8$ | $n_7$ |
| $S_9$ | $n_6$ | $n_7$ | 1 | $n_5$ | $n_4$ | $n_3 \oplus 1$ | $n_2 \oplus n_8$ | $n_1 \oplus n_7$ | $n_0 \oplus n_6$ | 0 | 0 | 0 | 0 | 0 | 0 | 0 | 1 | $n_8$ |
| $S_{10}$ | $n_8$ | $n_6$ | $n_7$ | 1 | $n_5$ | $n_4$ | $n_3 \oplus 1$ | $n_2 \oplus n_8$ | $n_1 \oplus n_7$ | $n_0 \oplus n_6$ | 0 | 0 | 0 | 0 | 0 | 0 | 0 | 1 |
| $S_{11}$ | 1 | $n_8$ | $n_6$ | $n_7$ | 1 | $n_5$ | $n_4$ | $n_3 \oplus 1$ | $n_2 \oplus n_8$ | $n_1 \oplus n_7$ | $n_0 \oplus n_6$ | 0 | 0 | 0 | 0 | 0 | 0 | 0 |
| $S_{12}$ | $n_0 \oplus n_6$ | 1 | $n_8$ | $n_6$ | $n_7$ | 1 | $n_5$ | $n_4$ | $n_3 \oplus 1$ | $n_2 \oplus n_8$ | $n_1 \oplus n_7$ | $n_0 \oplus n_6$ | 0 | 0 | 0 | 0 | 0 | 0 |
| $S_{13}$ | $n_1 \oplus n_7$ | $n_0 \oplus n_6$ | 1 | $n_8$ | $n_6$ | $n_7$ | 1 | $n_5$ | $n_4$ | $n_3 \oplus 1$ | $n_2 \oplus n_8$ | $n_1 \oplus n_7$ | $n_0 \oplus n_6$ | 0 | 0 | 0 | 0 | 0 |
| $S_{14}$ | $n_2 \oplus n_8$ | $n_1 \oplus n_7$ | $n_0 \oplus n_6$ | 1 | $n_8$ | $n_6$ | $n_7$ | 1 | $n_5$ | $n_4$ | $n_3 \oplus 1$ | $n_2 \oplus n_8$ | $n_1 \oplus n_7$ | $n_0 \oplus n_6$ | 0 | 0 | 0 | 0 |
| $S_{15}$ | $n_3 \oplus 1$ | $n_2 \oplus n_8$ | $n_1 \oplus n_7$ | $n_0 \oplus n_6$ | 1 | $n_8$ | $n_6$ | $n_7$ | 1 | $n_5$ | $n_4$ | $n_3 \oplus 1$ | $n_2 \oplus n_8$ | $n_1 \oplus n_7$ | $n_0 \oplus n_6$ | 0 | 0 | 0 |
| $S_{16}$ | $n_4$ | $n_3 \oplus 1$ | $n_2 \oplus n_8$ | $n_1 \oplus n_7$ | $n_0 \oplus n_6$ | 1 | $n_8$ | $n_6$ | $n_7$ | 1 | $n_5$ | $n_4$ | $n_3 \oplus 1$ | $n_2 \oplus n_8$ | $n_1 \oplus n_7$ | $n_0 \oplus n_6$ | 0 | 0 |

FIG. 8

<TABLE 2>

| P | $x_0$ | $x_1$ | $x_2$ | $x_3$ | $x_4$ | $x_5$ | $x_6$ | $x_7$ | $x_8$ | $x_9$ | $x_{10}$ | $x_{11}$ | $x_{12}$ | $x_{13}$ | $x_{14}$ | $x_{15}$ | $x_{16}$ | $x_{17}$ |
|---|---|---|---|---|---|---|---|---|---|---|---|---|---|---|---|---|---|---|
| $S_1$ | 0 | 0 | 0 | 0 | 0 | 0 | 0 | $n_0$ | $n_1$ | $n_2$ | $n_3$ | $n_4$ | $n_5$ | 1 | $n_6$ | $n_7$ | $n_8$ | 1 |
| $S_2$ | 0 | 0 | 0 | 0 | 0 | 0 | $n_0$ | $n_1$ | $n_2$ | $n_3$ | $n_4$ | $n_5$ | 1 | $n_6$ | $n_7$ | $n_8$ | 1 | $n_0$ |
| $S_3$ | 0 | 0 | 0 | 0 | 0 | $n_0$ | $n_1$ | $n_2$ | $n_3$ | $n_4$ | $n_5$ | 1 | $n_6$ | $n_7$ | $n_8$ | 1 | $n_0$ | $n_1$ |
| $S_4$ | 0 | 0 | 0 | 0 | $n_0$ | $n_1$ | $n_2$ | $n_3$ | $n_4$ | $n_5$ | 1 | $n_6$ | $n_7$ | $n_8$ | 1 | $n_0$ | $n_1$ | $n_2$ |
| $S_5$ | 0 | 0 | 0 | $n_0$ | $n_1$ | $n_2$ | $n_3$ | $n_4$ | $n_5$ | 1 | $n_6$ | $n_7$ | $n_8$ | 1 | $n_0$ | $n_1$ | $n_2$ | $n_3$ |
| $S_6$ | 0 | 0 | $n_0$ | $n_1$ | $n_2$ | $n_3$ | $n_4$ | $n_5$ | 1 | $n_6$ | $n_7$ | $n_8$ | 1 | $n_0$ | $n_1$ | $n_2$ | $n_3$ | $n_4$ |
| $S_7$ | 0 | $n_0$ | $n_1$ | $n_2$ | $n_3$ | $n_4$ | $n_5$ | 1 | $n_6$ | $n_7$ | $n_8$ | 1 | $n_0$ | $n_1$ | $n_2$ | $n_3$ | $n_4$ | $n_5$ |
| $S_8$ | $n_0$ | $n_1$ | $n_2$ | $n_3$ | $n_4$ | $n_5$ | 1 | $n_6$ | $n_7$ | $n_8$ | 1 | $n_0$ | $n_1$ | $n_2$ | $n_3$ | $n_4$ | $n_5$ | $n_0 \oplus n_6$ |
| $S_9$ | $n_1$ | $n_2$ | $n_3$ | $n_4$ | $n_5$ | 1 | $n_6$ | $n_7$ | $n_8$ | 1 | $n_0$ | $n_1$ | $n_2$ | $n_3$ | $n_4$ | $n_5$ | $n_0 \oplus n_6$ | $n_1 \oplus n_7$ |
| $S_{10}$ | $n_2$ | $n_3$ | $n_4$ | $n_5$ | 1 | $n_6$ | $n_7$ | $n_8$ | 1 | $n_0$ | $n_1$ | $n_2$ | $n_3$ | $n_4$ | $n_5$ | $n_0 \oplus n_6$ | $n_1 \oplus n_7$ | $n_2 \oplus n_8$ |
| $S_{11}$ | $n_3$ | $n_4$ | $n_5$ | 1 | $n_6$ | $n_7$ | $n_8$ | 1 | $n_0$ | $n_1$ | $n_2$ | $n_3$ | $n_4$ | $n_5$ | $n_0 \oplus n_6$ | $n_1 \oplus n_7$ | $n_2 \oplus n_8$ | $n_3 \oplus 1$ |
| $S_{12}$ | $n_4$ | $n_5$ | 1 | $n_6$ | $n_7$ | $n_8$ | 1 | $n_0$ | $n_1$ | $n_2$ | $n_3$ | $n_4$ | $n_5$ | $n_0 \oplus n_6$ | $n_1 \oplus n_7$ | $n_2 \oplus n_8$ | $n_3 \oplus 1$ | $n_4 \oplus n_0$ |
| $S_{13}$ | $n_5$ | 1 | $n_6$ | $n_7$ | $n_8$ | 1 | $n_0$ | $n_1$ | $n_2$ | $n_3$ | $n_4$ | $n_5$ | $n_0 \oplus n_6$ | $n_1 \oplus n_7$ | $n_2 \oplus n_8$ | $n_3 \oplus 1$ | $n_4 \oplus n_0$ | $n_5 \oplus n_1$ |
| $S_{14}$ | 1 | $n_6$ | $n_7$ | $n_8$ | 1 | $n_0$ | $n_1$ | $n_2$ | $n_3$ | $n_4$ | $n_5$ | $n_0 \oplus n_6$ | $n_1 \oplus n_7$ | $n_2 \oplus n_8$ | $n_3 \oplus 1$ | $n_4 \oplus n_0$ | $n_5 \oplus n_1$ | $1 \oplus n_2$ |
| $S_{15}$ | $n_6$ | $n_7$ | $n_8$ | 1 | $n_0$ | $n_1$ | $n_2$ | $n_3$ | $n_4$ | $n_5$ | $n_0 \oplus n_6$ | $n_1 \oplus n_7$ | $n_2 \oplus n_8$ | $n_3 \oplus 1$ | $n_4 \oplus n_0$ | $n_5 \oplus n_1$ | $1 \oplus n_2$ | $n_6 \oplus n_3$ |
| $S_{16}$ | $n_7$ | $n_8$ | 1 | $n_0$ | $n_1$ | $n_2$ | $n_3$ | $n_4$ | $n_5$ | $n_0 \oplus n_6$ | $n_1 \oplus n_7$ | $n_2 \oplus n_8$ | $n_3 \oplus 1$ | $n_4 \oplus n_0$ | $n_5 \oplus n_1$ | $1 \oplus n_2$ | $n_6 \oplus n_3$ | $n_7 \oplus n_4$ |

FORWARD MULTIPLE SCRAMBLING CODE GENERATING METHOD AND APPARATUS

BACKGROUND OF THE INVENTION

1. Field of the Invention

The present invention relates to a mobile communication system, and more particularly to a forward multiple scrambling code generating method and apparatus.

2. Background of the Related Art

The Third Generation Partnership Project (3GPP) was recently established to make a technical standard for next generation mobile communication systems. The 3GPP proposes having a transport channel, a physical channel, a dedicated channel, and a common channel as channels for downlinks. In a next generation code division multiple access (CDMA) mobile communication system, respective downlink physical channels allocated for a plurality of subscribers are distinguished from one another using intrinsic orthogonal codes so that they can simultaneously transmit data at the same frequency. That is, each base station or cell of the next generation mobile communication system is distinguishable from other base stations or cells, based on an associated intrinsic scrambling code multiplied with a user bit transmitted through the physical channel thereof. In order to distinguish subscribers of each base station from one another, different channelization codes are multiplied with the respective user bit. The reason why base stations or subscribers should be distinguished from one another is that the next generation mobile communication system is based on an asynchronous system in which base stations are not synchronous with one another.

To distinguish among base stations in the next generation communication system, therefore, a system is employed in which each base station is allocated with an intrinsic scrambling code different from those of other base stations. In order to allow a flexible cell design, 512 intrinsic scrambling codes are set. Also, Gold codes are typically used.

A multiple scrambling code is additionally used in the next generation mobile communication system to satisfy a shortage of scrambling codes caused by an increase in the number of subscribers. Thus, each base station transmits user signals after modulating them using several scrambling codes.

The multiple scrambling code used to allow an increase in the number of subscribers, as mentioned above, will be described in more detail.

The multiple scrambling code includes a primary scrambling code and a secondary scrambling code. The primary scrambling code are defined as a common pilot channel and a common control channel, for base stations, which are used for channels adapted to transmit base station information. Codes other than such a primary scrambling code are defined as the secondary scrambling code. Assuming that M secondary scrambling codes are used for each of N base stations, N*(M+1) scrambling codes are totally required for the system. These scrambling codes may be generated by a code generator configured as shown in FIG. 1.

FIG. 1 is a circuit diagram illustrating a related art scrambling code generator. Referring to FIG. 1, the scrambling code generator is configured to vary the initial value of each of shift registers 1 respectively associated with the primary and secondary scrambling codes while fixing the initial value of a shift register 2, associated with the shift register 1 to a value of "1", thereby generating a maximum of $2^{18}$ different scrambling codes.

To generate one of the N*(M+1) different scrambling codes, for example the k-th scrambling code, a one-to-one mapping rule is required between the initial value of the shift register 1 and the value of k in the code generator shown in FIG. 1. If such a mapping rule were simpler, the calculation of the initial value based on the value of k can be simplified.

For such a mapping rule between the initial value of the shift register 1 and the value of k, accordingly, a method may be proposed in which a binary expression of the value of k is used for the initial value of a gold code generator. In accordance with this method, N*(M+1) scrambling codes are sorted into a primary scrambling code set or secondary scrambling code sets, respectively.

FIG. 2 is a diagram illustrating a related art scrambling code sorting system. Referring to FIG. 2, N scrambling codes, for example 0-th to 511-th are allocated for a primary scrambling code set. The remaining scrambling codes following the primary scrambling code set are allocated for the M secondary scrambling codes in such a fashion that one secondary scrambling code set consists of 511 successive scrambling codes. Thus, N*(M+1) scrambling codes are respectively sorted (N=0, . . . , 511). Accordingly, the m-th secondary scrambling code set consists of (m*512)-th, . . . , (m*512+511)-th (m=1, . . . , M) scrambling codes.

In accordance with such a code sorting system, a base station, which uses the k-th primary scrambling code of the primary scrambling code set, should use respective k-th secondary scrambling codes of the secondary scrambling code sets for the secondary scrambling codes thereof.

The above mentioned mapping rule and code sorting system make it possible to more simply set the initial value of the scrambling code generator. In other words, where a base station, which uses the k-th one of N primary scrambling codes (where, for example, N=512), is required to generate the m-th secondary scrambling code, the initial value of the scrambling code generator can be simply determined by a binary expression of the values of k and m, without any additional calculation.

Another scrambling code sorting system may be used in which the k-th one of N*(M+1) different scrambling codes is generated using an initial value obtained by shifting the initial value, used for the generation of the first scrambling code, by k−1 times.

For example, assuming that the initial value used for the generation of the first scrambling code is set with "0, 0, 0, . . . , 0, 0, 1", and the first scrambling code generated based on this initial value corresponds to "x(0), x(1), . . . ", the initial value used for the generation of the k-th scrambling code corresponds to "x(16+k), x(15+k), . . . , x(k+1), x(k), x(k−1)".

In this case, accordingly, a code sorting system of FIG. 3 is used. In accordance with this code sorting system, N*(M+1) scrambling codes are sorted into a primary scrambling code set or secondary scrambling code sets, respectively, in such a fashion that the ((M+1)*(k−1)+1)-th scrambling code is allocated for the k-th main scrambling code whereas ((M+1)*(k−1)+2)-th, . . . , and ((M+1)*(k−1)+M+1)-th scrambling codes are allocated for respective secondary scrambling codes associated with the k-th primary scrambling code.

This means that in a base station using the k-th primary scrambling code, the m-th secondary scrambling code is generated using an initial value obtained by shifting the initial value, used for the generation of the k-th primary scrambling code, by m times.

Both of the above mentioned scrambling code generating methods have various problems.

For example, although the first scrambling code generating method minimizes the number of calculations to set the initial value upon generating a single scrambling code because that initial value can be simply determined using the scrambling number, it requires two code generators for a multiple scrambling code system in which a primary scrambling code and a secondary scrambling code are simultaneously generated. Such a multiple scrambling code system cannot be implemented using a single code generator.

Generally, a user element should simultaneously receive a common pilot channel and a data channel. In a specific user element in which its data channel is to be transmitted in a state modulated with a secondary scrambling code, it is necessary to simultaneously generate primary and secondary scrambling codes in order to simultaneously detect control information and data. In such a user element using two code generators for the simultaneous generation of primary and secondary scrambling codes, there is a problem in that the size and power consumption of the user element increase. This also results in an enlargement of the system configuration, thereby causing an increase in the hardware overhead.

In the second scrambling code generating method using a scrambling code sorting system in which an initial value associated with the k-th one of N*(M+1) different scrambling codes is obtained by shifting the initial value, used for the generation of the first scrambling code, by (M+1)*k−1 times, the number of calculations need to set the initial value increases greatly in accordance with an increase in the value of k. This results in a time delay in the system.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide a method and system for generating a forward multiple scrambling code.

Another object of the present invention is to provide a method and system capable of simultaneously generating a primary scrambling code and a secondary scrambling code using a single code generator in a system in which a basic station uses a plurality of scrambling codes to increase the number of subscribers.

Another object of the invention is to provide a forward multiple scrambling code generating method and apparatus capable of simultaneously generating a primary scrambling code and a secondary scrambling code using a single code generator while simplifying an initial code value setting carried out in the code generator.

To achieve at least the above stated objects in whole or in parts, there is provided a forward multiple scrambling code generating method in a communication system, in which each of a number of base stations uses an associated one of primary scrambling codes and an associated one of secondary scrambling code sets each consisting of a plurality of secondary scrambling codes, comprising the steps of: when an n-th one of the primary scrambling codes is to be generated from a generator adapted to generate the scrambling codes, setting an initial value of the scrambling code generator with a binary value of "n", thereby generating a desired primary scrambling code; and when an n-th one of the secondary scrambling codes in an m-th one of the secondary scrambling code sets is to be generated from the scrambling code generator, setting an initial value of the scrambling code generator with a value obtained by shifting the n-th primary scrambling code by m times, thereby generating a desired secondary scrambling code.

Preferably, the initial value of the scrambling code generator adapted to generate the n-th primary scrambling code is set by setting the 7-th and 11-th ones of bits, included in the initial value, with a value of 1, setting the first through 10-th ones of the bits, except for the 7-th and 11-th bits, with a binary expression of "n" consisting of different 8 bits, respectively, and setting the remaining ones of the bits, other than the first through 11-th bits, with a value of "0".

To further achieve at least the above stated objects in whole or in parts, there is provided a forward multiple scrambling code generating apparatus that includes a first shift register for shifting bits of a bit stream by one bit in response to every inputting of an external unit clock, respectively, thereby outputting data for the generation of a primary scrambling code; a second shift register for shifting bits of a bit stream by one bit in response to every inputting of an external unit clock, respectively, thereby outputting data for the generation of a secondary scrambling code as well as the primary scrambling code; a masking function unit for receiving respective outputs from the first and second shift registers, and carrying out a masking function for the received data, thereby outputting data for the generation of the secondary scrambling code; the primary scrambling code being generated in accordance with a binary addition of the output from the second shift register to the output from the first shift register; and the secondary scrambling code being generated in accordance with a binary addition of the output from the masking function unit to the output from the second shift register.

To further achieve at least the above stated objects in whole or in parts, there is provided a method of generating multiple scrambling codes in a communication system, in which each of a plurality of base stations uses one of a plurality of primary scrambling codes and one of a plurality of secondary scrambling code sets each having a plurality of secondary scrambling codes, including setting an initial value of a scrambling code generator to a binary value of "n" when a n-th one of the plurality of primary scrambling codes is to be generated from the scrambling code generator to generate a desired primary scrambling code, and setting an initial value of the scrambling code generator with a value obtained by shifting the n-th primary scrambling code by m times to generate a secondary scrambling code.

To further achieve at least the above stated objects in whole or in parts, there is provided a method of generating multiple scrambling codes, including generating a plurality of primary scrambling codes, for each of the plurality of primary scrambling codes, generating a plurality of secondary scrambling codes by shifting the selected primary scrambling code by prescribed numbers of times, comparing each of the plurality of primary scrambling codes to an initial value of each of the secondary scrambling codes; and discarding each one of the primary scrambling codes that has a value equal to the secondary scrambling codes.

To further achieve at least the above stated objects in whole or in parts, there is provided a forward multiple scrambling code generating apparatus, including a first shift register, which shifts bits of a bit stream by one bit in response to every input of an external unit clock, respectively, and outputs data for the generation of a primary scrambling code, a second shift register, which shifts bits of a bit stream by one bit in response to every input of an external unit clock, respectively, and outputs data for the generation of the primary scrambling code and a secondary scrambling code, a masking function unit, which receives respective outputs from the first and second shift registers, and performs a masking function for the received data to output data for the generation of the secondary scrambling code, wherein the primary scrambling code is generated by performing a binary addition of the output from the second shift register to an output from the first shift register, and the secondary scrambling code is generated by performing a binary addition of the output from the masking function unit to the output from the second shift register.

To further achieve at least the above stated objects in whole or in parts, there is provided a code generating apparatus, including a first shift register, which outputs a first register output, a second shift register, which outputs a second register output, and a masking function unit, coupled to receive the first and second register outputs, and output a masking output, wherein the first register output and the second register output are combined to generate a primary scrambling code, and the second register output and the masking output are combined to generate a secondary scrambling code.

To further achieve at least the above stated objects in whole or in parts, there is provided a method of generating multiple scrambling codes in a communication system, including generating a primary scrambling code by setting an initial value of a scrambling code to a binary value of "n" when a n-th one of the plurality of primary scrambling codes is to be generated, and generating an n-th secondary scrambling code set corresponding to the n-th primary scrambling code by shifting the n-th primary scrambling code by each of 0 through M times, wherein M is a number of secondary codes in the secondary code set.

Preferably, the first shift register has a configuration of 18 bits in which a value obtained after a binary addition of an output from the digit of a 0-th one of the 18 bits to an output from the digit of a 7-th one of the 18 bits is fed back to the digit of a 17-th one of the 18 bits. The second shift register preferably has a configuration of 18 bits in which a value obtained after a binary addition of outputs from respective digits of an 0-th one, a 5-th one, a 7-th one, and a 10th one of the 18 bits is fed back to the digit of a 17-th one of the 18 bits.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 2 and 3 are diagrams respectively illustrating related art scrambling code sorting systems;

FIGS. 7 and 8 are tables of initial values for the generation of primary and secondary scrambling codes used in the scrambling code generating apparatus of FIG. 1, respectively.

DETAILED DESCRIPTION OF PREFERRED EMBODIMENTS

Figure 1:
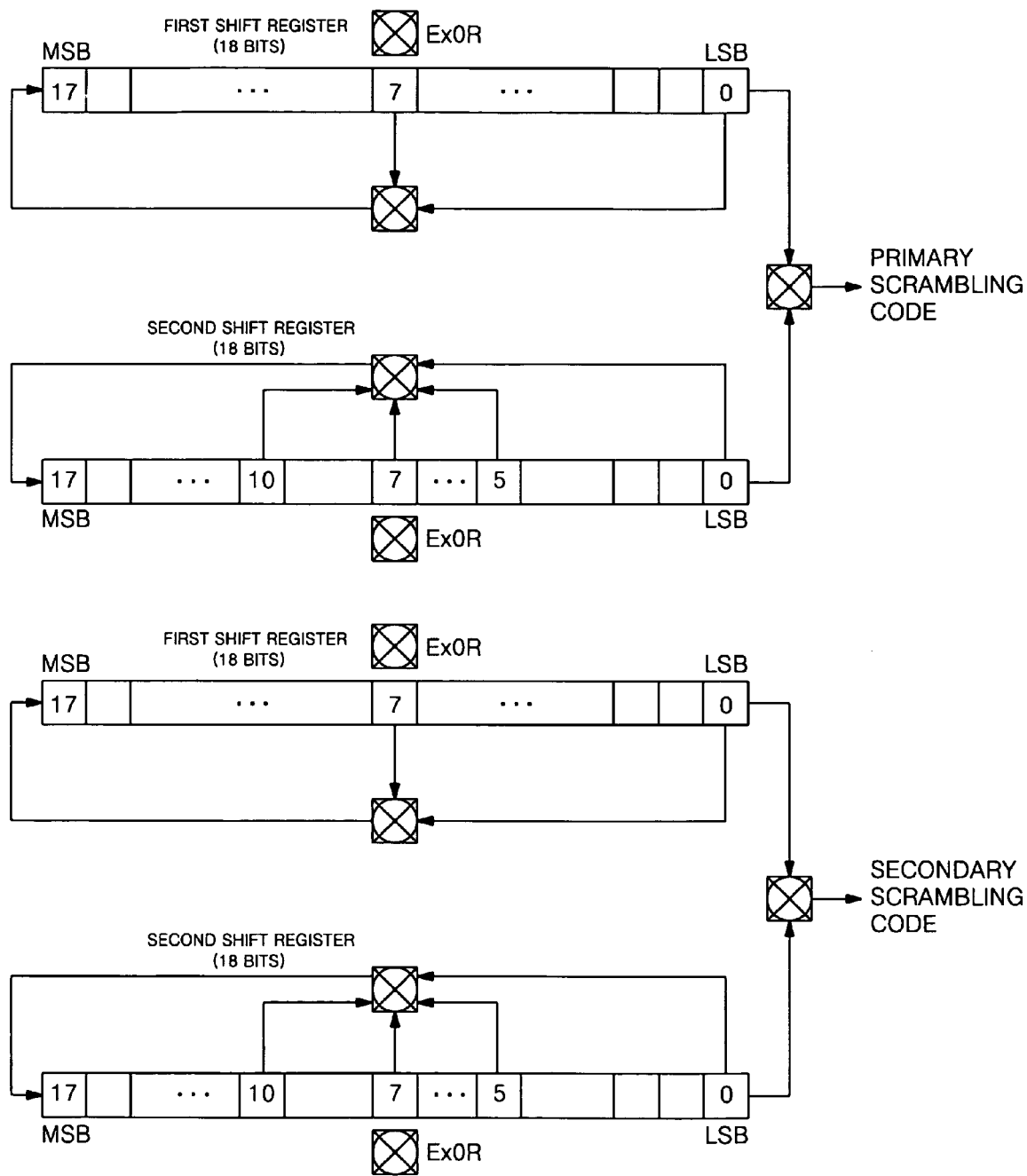
FIG. 1 is a circuit diagram illustrating a related art scrambling code generator.
Figure 2:
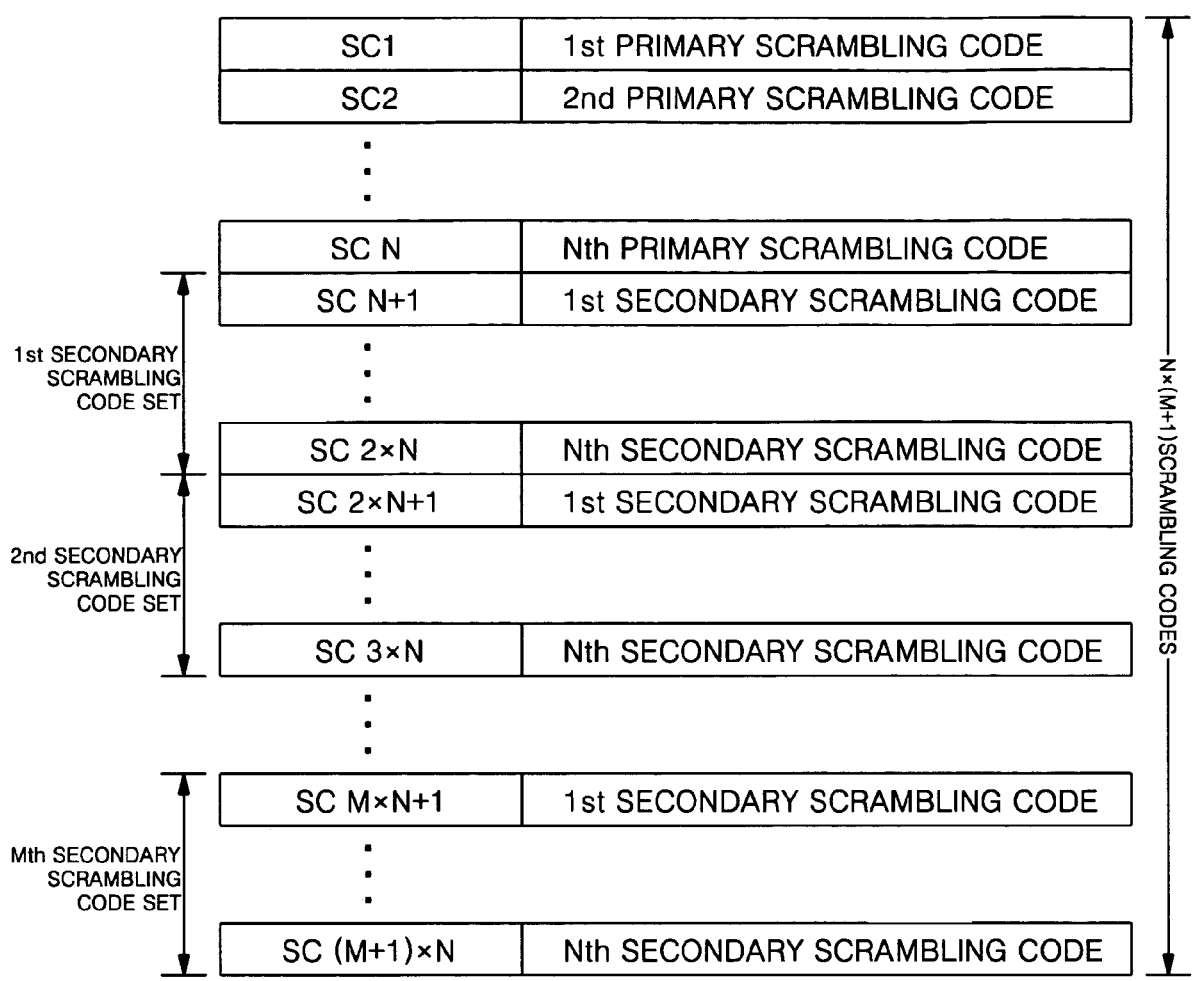
Figure 4:
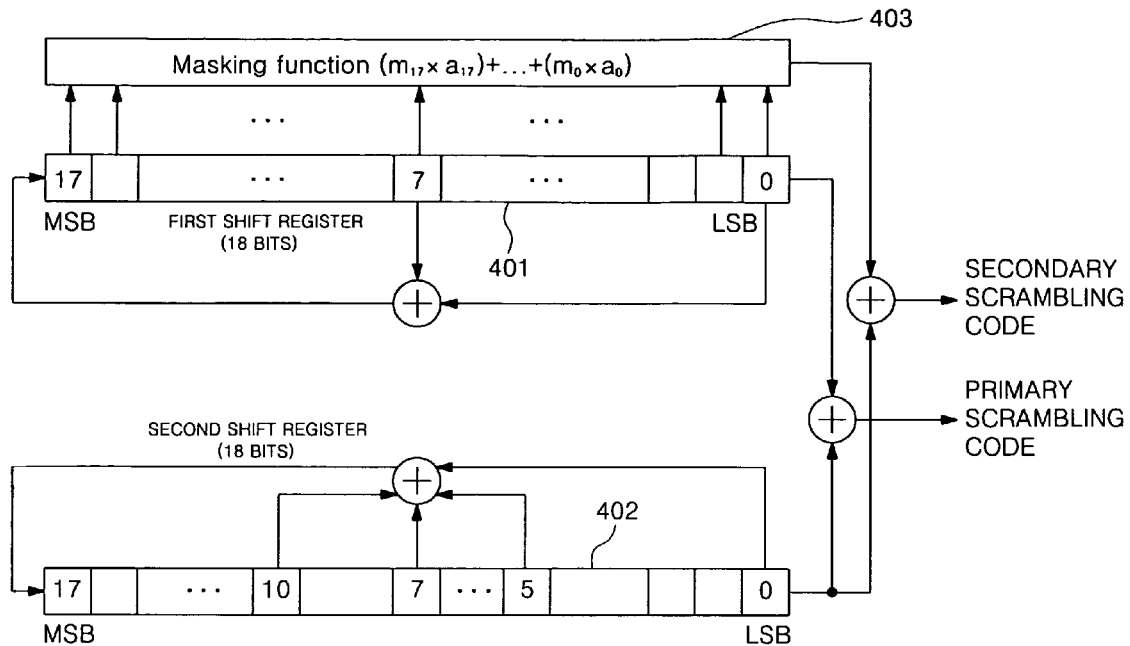
FIG. 4 is a circuit diagram illustrating a forward multiple scrambling code generating apparatus according to a preferred embodiment of the present invention.

Referring to FIG. 4, a forward multiple scrambling code generating apparatus according to a preferred embodiment of the present invention is illustrated. As shown in FIG. 4, the apparatus includes a first shift register 401 for shifting bits of a bit stream by one bit in response to every inputting of an external unit clock, respectively. The first shift register 401 outputs data for the generation of a primary scrambling code. The apparatus also includes a second shift register 402 for shifting bits of a bit stream by one bit in response to an external unit clock, respectively, and outputs data for the generation of primary and secondary scrambling codes.

A masking function unit 403 is coupled to both the first and second shift registers 401 and 402. The masking function unit receives respective outputs from the first and second shift registers 401 and 402, and carries out a masking function for the received data, and outputs data for the generation of the secondary scrambling code.

In a preferred embodiment, the first shift register 401 consists of 18 bits. A value obtained after a binary addition of an output from the digit of the 0-th bit to an output from the digit of the 7-th bit is fed back to the digit of the 17-th bit. The second shift register 402 consists of 18 bits. A value obtained after a binary addition of outputs from respective digits of the 0-th, 5-th, 7-th, and 10-th bits is fed back to the digit of the 17-th bit.

The primary scrambling code is preferably obtained by a binary addition of an output from the second shift register 402 to an output from the first shift register 401. The secondary scrambling code is preferably obtained by a binary addition of the output from the second shift register 402 to an output from the masking function unit 403.

Figure 5:
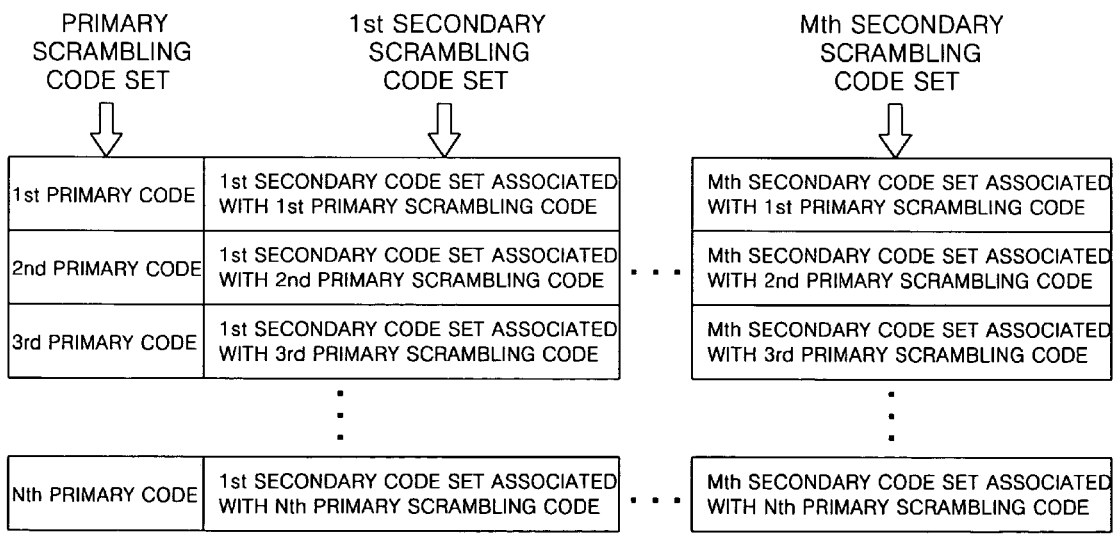
FIG. 5 is a diagram illustrating a scrambling code sorting system used in a forward scrambling code generating method according to a preferred embodiment of the present invention.

FIG. 5 is a diagram illustrating a scrambling code sorting system used in a scrambling code generating method according to a preferred embodiment of the present invention. This scrambling code sorting system has a two-dimensional code array.

The scrambling code generating apparatus uses a mapping rule in which an initial value associated with the n-th primary scrambling code to be generated is set with a value simply converting the value of n. The n-th secondary scrambling code of the m-th secondary scrambling code set is generated using an initial value set with a value obtained after shifting the n-th primary scrambling code by m times. It is thus possible to achieve a simple initial value setting of the code generator using the primary scrambling codes. Also, in accordance with the sorting system for secondary scrambling codes, associated code shift characteristics, and the configuration of the scrambling code generating apparatus shown in FIG. 4, the main scrambling code used in a base station and the m-th secondary scrambling code are simultaneously generated using the following masking function:

if m=1 "0,0,0,0,0,0,0,0,0,0,0,0,0,0,0,0,1,0"

if m=2 "0,0,0,0,0,0,0,0,0,0,0,0,0,0,0,1,0,0"

if m=3 "0,0,0,0,0,0,0,0,0,0,0,0,0,0,1,0,0,0"

. . .

if m=15, "0,0,1,0,0,0,0,0,0,0,0,0,0,0,0,0,1,0"

if m=16, "0,1,0,0,0,0,0,0,0,0,0,0,0,0,0,0,1,0"

In this example, the number of primary scrambling codes is N(N=512), while the number of secondary scrambling code sets is M. A mapping rule is thus required between the initial value associated with the generation of an n-th primary scrambling code and the binary expression of the value of n in order to allow respective initial values, associated with the generation of 512*(M+1) scrambling codes, to be different from one another.

Figure 6:
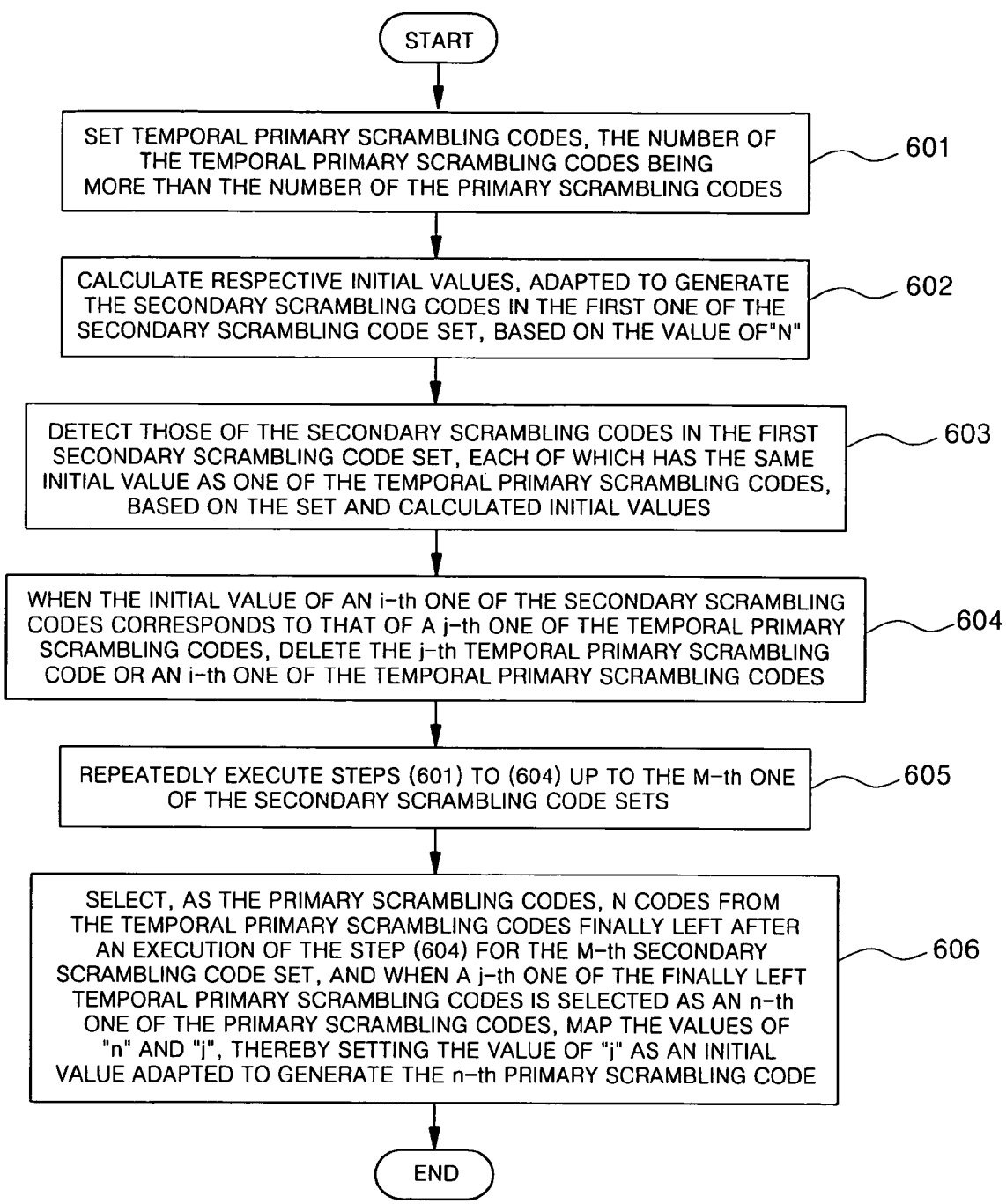
FIG. 6 is a flow chart illustrating a procedure for setting the initial value of a scrambling code generator in accordance with a preferred embodiment of the scrambling code generating method of the present invention.

A mapping rule applied to the scrambling code generating method according to a preferred embodiment of the present invention will be described with reference to FIG. 6. Referring to FIG. 6, the temporal primary scrambling codes are first set, the number of which is more than the number of required primary scrambling codes. For example, where the number of required primary scrambling codes is N (N=512), P (P=1,024 or 2,084) temporal primary scrambling codes are set. That is, the initial value of an n-th (n=1, . . . , P) temporal primary scrambling code is set to have a value of n, taking into consideration the number of temporal primary scrambling codes, as shown in Step 601.

Thereafter, respective initial values, which are set for the generation of P secondary scrambling codes in the first secondary scrambling code set, are calculated. This calculation is performed using results obtained by shifting an associated one of the temporal primary scrambling codes one time on the basis of the definition of secondary scrambling codes, as shown in step 602.

Based on the set and calculated initial values, the secondary scrambling codes in the first secondary scrambling code set are detected. Each of these codes has the same initial value as one of the temporal primary scrambling codes, as shown in Step 603. Where the initial value of the i-th secondary scrambling code corresponds to that of the j-th temporal primary scrambling code, the j-th temporal primary scrambling code or the i-th temporal primary scrambling code is excluded from the temporal primary scrambling code set, as shown in Step 604. Step 605 shows that the above procedure from step 601 to step 604 is then repeatedly executed up to the M-th secondary scrambling code set.

After the repeated execution of the above procedure, the temporal primary scrambling code set contains temporal primary scrambling codes that are reduced in number from the initially set P temporal primary scrambling codes. If M is an appropriate size, the number of codes in the final temporal primary scrambling code set is thus more than N. Specifically, it is the number of required primary scrambling codes.

Accordingly, N codes are selected from the final temporal primary scrambling code set so that they are used as primary scrambling codes. In this case, taking into consideration the condition in which the j-th scrambling code of the final temporal primary scrambling code set may be selected as the n-th primary scrambling code, it is necessary to establish a simple mapping rule between "n" and "j". That is, the values of "n" and "j" are mapped to set the value of "j" as the initial value for the generation of the n-th primary scrambling code.

FIGS. 7 and 8 illustrate examples of initial values set in accordance with the above mentioned mapping rule for the generation of primary and secondary scrambling codes. In this example, the number of primary scrambling codes, N, is 512, and the number of secondary scrambling code sets, M, is 16. The initial values described in Table 1 of FIG. 7 and the initial values described in Table 2 of FIG. 8 each have the same effect as the other. Accordingly, the following description will be made only in conjunction with Table 1 of FIG. 7.

Assuming that "$n_8, n_7, \ldots, n_1, n_0$" is a binary expression of "n" (n=0, . . . , 511), the initial value for an n-th primary scrambling code can be expressed by "0, 0, . . . 0, 0, 1, $n_8$, $n_7, n_6, n_5, \ldots, n_1, n_0$", as shown in Table 1 of FIG. 7. That is, the initial value adapted to generate the n-th primary scrambling code is set by setting the 7-th and 11-th ones of bits, included in the initial value, to a value of 1, setting the first through 10th ones of those bits, except for the 7-th and 11-th bits, to a binary expression of "n" consisting of eight (8) different bits, respectively, and setting the remaining bits, other than the first through 11-th bits, to a value of "0".

Also, the initial value of a n-th secondary scrambling code in a m-th (m=1, . . . , 16) secondary scrambling code set is set with a value obtained by shifting the n-th primary scrambling code by m times. The results are depicted in FIG. 7 (Table 1). The mapping rule shown in Table 1 can be applied to an expanded case, in which the number of secondary scrambling code sets, M, is increased up to 24. In this case, all the 512*25 scrambling codes are different from one another.

As can be seen, the initial value for the generation of scrambling codes is set using the code number of an associated primary scrambling code, as shown, for example in Table 1. Also, initial values for the generation of respective n-th secondary scrambling codes of the secondary scrambling code sets, that is, respective secondary scrambling codes associated with the n-th primary scrambling code, are set using values respectively obtained by shifting the n-th primary scrambling code by one time, 2 times, . . . , N times, as further shown in Table 1.

The present invention provides, at a minimum, a forward multiple scrambling code generating method and apparatus capable of simultaneously generating a primary scrambling code and a secondary scrambling code using a single code generator. This can be used, for example, when a particular base station is required to generate those scrambling codes in a simultaneous fashion. Accordingly, the present invention provides advantages in that the manufacturing costs and load are reduced. It is also possible to reduce the size and power consumption of user elements. Since the initial value required for the generation of a particular primary scrambling code corresponds to the code number of the primary scrambling code, and is therefore known, it is possible to greatly reduce the amount of calculations needed to set the initial values required for the generation of scrambling codes. Thus, there is an advantage in that it is possible to greatly reduce a time delay involved in conventional cases due to a large amount of calculation for the setting of initial values.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of generating multiple scrambling codes at a base station in order to communicate with a plurality of mobile stations in a WCDMA communication system, comprising:

generating a primary scrambling code by setting an initial value of a scrambling code to a binary value of "n" when a n-th one of a plurality of primary scrambling codes is to be generated;

generating a n-th secondary scrambling code set corresponding to the n-th primary scrambling code by shifting an initial value of the n-th primary scrambling code; and wherein setting the initial value comprises:

(a) setting a plurality of temporal primary scrambling codes, number of the temporal primary scrambling codes being more than number of the primary scrambling codes;

(b) setting the initial value, adapted to generate a n-th one of the temporal primary scrambling codes, with a value of "n";

(c) calculating respective initial values, adapted to generate the a secondary scrambling codes in a first one of the secondary scrambling code set, based on the value of "n"

(d) detecting each secondary scrambling code in a secondary scrambling code set that have the same initial value as one of the temporal primary scrambling codes, based on the set and calculated initial values;

(e) discarding the j-th temporal primary scrambling code or a i-th one of the temporal primary scrambling codes when the initial value of an i-th one of the secondary scrambling codes corresponds to that of a j-th one of the temporal primary scrambling codes;

(f) repeatedly executing steps (b) through (e) up to an M-th one of the secondary scrambling code sets; and (g) selecting as the primary scrambling codes N codes from a remaining temporal primary scrambling codes after executing step (d) for the M-th secondary scrambling code set, and when a j-th one of a finally left temporal primary scrambling codes is selected as an n-th one of the primary scrambling codes, mapping the values of "n" and "j", thereby setting the value of "j" as an initial value adapted to generate the n-th primary scrambling code;

storing the primary scrambling code and the secondary scrambling code corresponding to the primary scrambling code.

2. The method of claim 1, wherein the initial value of the primary scrambling code is set by setting a 7-th and 11-th bit included in the initial value to a value of 1, setting a first through 10-th bits, except for the 7-th and 11-th bits, to a binary expression of "n" including different 8 bits, respectively, and setting remaining ones of the bits, other than the first through 11-th bits, to a value of "0".

3. The method of claim 1, wherein generating the primary scrambling codes and n-th second scrambling code set are generating using the table shown in FIG. 7, where the number of primary scrambling codes, N, is 512, and the number of secondary scrambling code sets, M, is 16.

4. The method of claim 1, wherein generating the primary scrambling codes and n-th second scrambling code set are generating using the table shown in FIG. 8, where the number of primary scrambling codes, N, is 512, and the number of secondary scrambling code sets, M, is 16.

5. The method of claim 1, wherein the primary scrambling code and the secondary scrambling code are generated concurrently.

6. The method of claim 1, wherein the primary scrambling code and the secondary scrambling code corresponding to the primary scrambling code are disposed in a two-dimensional code array.

* * * * *